United States Patent
Atanasova et al.

(10) Patent No.: US 9,214,436 B2
(45) Date of Patent: Dec. 15, 2015

(54) ETCHING OF UNDER BUMP METTALLIZATION LAYER AND RESULTING DEVICE

(71) Applicant: GLOBALFOUNDRIES Inc., Grand Cayman (KY)

(72) Inventors: Tanya Andreeva Atanasova, Dresden (DE); Reiner Willeke, Dresden (DE); Anh Ngoc Duong, Fremont, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/172,323

(22) Filed: Feb. 4, 2014

(65) Prior Publication Data

US 2015/0221605 A1    Aug. 6, 2015

(51) Int. Cl.
*H01L 21/44* (2006.01)
*H01L 23/00* (2006.01)

(52) U.S. Cl.
CPC ............. *H01L 24/13* (2013.01); *H01L 24/11* (2013.01); *H01L 2224/1145* (2013.01); *H01L 2224/1181* (2013.01); *H01L 2224/11462* (2013.01); *H01L 2224/11614* (2013.01); *H01L 2224/11831* (2013.01); *H01L 2224/13023* (2013.01); *H01L 2224/13147* (2013.01); *H01L 2224/13166* (2013.01); *H01L 2924/0531* (2013.01); *H01L 2924/0549* (2013.01); *H01L 2924/2064* (2013.01); *H01L 2924/20102* (2013.01)

(58) Field of Classification Search
CPC ................. H01L 21/3111; H01L 2924/01079
USPC .......................... 438/612, 613, 614, 738, 739
See application file for complete search history.

(56) References Cited

U.S. PATENT DOCUMENTS

| | | | |
|---|---|---|---|
| 6,436,300 B2 * | 8/2002 | Woolsey et al. | 216/13 |
| 6,750,133 B2 * | 6/2004 | Datta | 438/613 |
| 8,389,397 B2 * | 3/2013 | Lei et al. | 438/614 |
| 2004/0080024 A1 | 4/2004 | Datta | |

* cited by examiner

*Primary Examiner* — Quoc Hoang
(74) *Attorney, Agent, or Firm* — Ditthavong & Steiner, P.C.

(57) ABSTRACT

Methods for wet etching a UBM layer and the resulting devices are disclosed. Embodiments may include patterning metal bumps on a wafer that has at least two metal layers thereon; exposing the wafer to a first acid solution to remove a portion of a first of the two metal layers exposed by the patterning of the metal bumps; and exposing the wafer to a second acid solution to remove a portion a second of the two metal layers exposed by the patterning of the metal bumps and the exposure of the wafer to the first acid solution, wherein an undercut below the metal bumps, formed by removal of the portions of the first and second metal layers, is less than 1.5 microns.

11 Claims, 6 Drawing Sheets

ETCHING OF UNDER BUMP METTALLIZATION LAYER AND RESULTING DEVICE

TECHNICAL FIELD

The present disclosure relates to fabrication of a metal bump, and particularly to reducing the undercut of a metal bump resulting from etching an under bump metallization (UBM) layer. The present disclosure is particularly applicable to 20 nanometer (nm) technology nodes and beyond.

BACKGROUND

UBM layers may be dry or wet etched to prevent shorts. Wet etching may be preferred over dry etching because no additional cleaning of etch residue is required. Wet etching costs also are less than dry etching. However, wet etching etches beneath mushroom plated metal bumps causing an undercut.

More specifically, UBM wet etching removes exposed metal layers that are masked either by a photoresist, such as in a solder paste process, or that are masked by a metal bump, such as in an electroplated solder process. Two issues that are addressed for a successful UBM etch are complete metal layer removal where left exposed and control of the undercut caused by undesirably removing the UBM layer from beneath the metal bump.

Current wet etching solutions that include sulfuric acid ($H_2SO_4$), hydrogen peroxide ($H_2O_2$), and water, followed by dilute hydrofluoric acid (HF) cause 2.5 to 3 microns of undercut of the metal bumps. Such a large amount of undercut reduces the stability of the metal bump. Further, the current wet etching solutions also attack layers of the metal bump, such as nickel or aluminum layers.

A need, therefore, exists for a method of wet etching a UBM layer that creates a smaller undercut of a metal bump and the resulting device.

SUMMARY

An aspect of the present disclosure is a method of wet etching a UBM layer that creates an undercut of a metal bump of less than 1.5 microns.

Another aspect of the present disclosure is a device having an undercut of a metal bump of less than 1.5 microns.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including patterning metal bumps on a wafer that has at least two metal layers thereon; exposing the wafer to a first acid solution to remove a portion of a first of the two metal layers exposed by the patterning of the metal bumps; and exposing the wafer to a second acid solution to remove a portion of a second of the two metal layers exposed by the patterning of the metal bumps and the exposure of the wafer to the first acid solution, wherein an undercut below the metal bumps, formed by removal of the portions of the first and second metal layers, is less than 1.5 microns.

An aspect of the present disclosure includes the first acid solution including phosphoric acid ($H_3PO_4$), $H_2O_2$, and water. Another aspect includes the first acid solution including 0.07% to 0.36% by volume of the $H_3PO_4$, 0.1% to 0.7% by volume of the $H_2O_2$, and the water for a remainder of the volume. A further aspect includes exposing the wafer to the first acid solution for 30 to 60 seconds at 30° to 40° C. An additional aspect includes the second acid solution including dilute HF, HF in an organic solvent, or a mixture of ammonia, $H_2O_2$, fluorine and water (APFM). Yet another aspect includes the second acid solution including 0.1% to 0.49% by volume of the HF with water for a remainder of the volume. Still another aspect includes exposing the wafer to the second acid solution for 20 to 40 seconds at 20° to 25° C. An additional aspect includes rinsing the wafer with deionized water after exposure with the second acid solution for 60 to 120 seconds at 20° to 25° C. Another aspect includes the undercut formed by removal of the portion of the metal layers below the metal bumps being 1 micron. A further aspect includes the first and second metal layers including a copper (Cu) layer having a thickness of 200 to 400 nanometers (nm) and a titanium (Ti) layer having a thickness of 100 to 200 nm, respectively, and the portions of the Cu layer and the Ti layer are completely removed after exposure to the first acid solution and the second acid solution. Still another aspect includes the metal bumps including a first Cu layer and the metal layers including a second Cu layer, and the first acid solution is selective to the second Cu layer over the first Cu layer. A further aspect includes forming the first Cu layer by electrochemical deposition (ECD) of Cu; and forming the second copper layer by physical vapor deposition (PVD) of the copper.

Another aspect of the present disclosure is a device including: a substrate; a metal seat layer above the substrate; and a metal bump above the metal seat layer, wherein the metal seat layer is formed by a wet etch of a UBM layer and an undercut of the metal seat layer below the metal bump is less than 1.5 microns.

Aspects include the metal seat layer including a Cu layer above a Ti layer. A further aspect includes the Cu layer having a thickness of 200 to 400 nm. Another aspect includes the Ti layer having a thickness of 100 to 200 nm. A further aspect includes the undercut of the metal seat layer below the metal bump being 1 micron.

Another aspect of the present disclosure includes a method including patterning metal bumps on a UBM layer on a wafer; performing a first wet etch of the under bump metallization layer on the wafer with a solution including 0.07% to 0.36% by volume of $H_3PO_4$, 0.1% to 0.7% by volume of $H_2O_2$, and water for a remainder of the volume; rinsing the wafer with deionized water for 60 to 120 seconds at 20° to 25° C.; performing a second wet etch of the UBM layer with a solution including 0.1% to 0.49% by volume of HF with water for a remainder of the volume; and rinsing the wafer with deionized water for 60 to 120 seconds at 20° to 25° C., wherein an undercut of the UBM layer under the metal bumps formed by removing the UBM layer exposed by the metal bumps is 1 micron.

A further aspect includes the UBM layer including a Cu layer having a thickness of 200 to 400 nanometers and a Ti layer having a thickness of 100 to 200 nm, and the Cu layer and the Ti layer are completely removed where exposed by the metal bumps after the first wet etch and the second wet etch.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1 through 6 schematically illustrate a method for wet etching a UBM layer to create an undercut of less than 1.5 microns, in which FIG. 6 illustrates a detailed portion of FIG. 5, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an undercut of metal bumps attendant upon wet etching a UBM layer. In accordance with embodiments of the present disclosure, acid solutions are used that create an undercut beneath the metal bumps of less than 1.5 microns.

Methodology in accordance with an embodiment of the present disclosure includes patterning metal bumps of a wafer that has at least two metal layers thereon, such as a UBM layer. The wafer is then exposed to a first acid solution to remove a portion of a first of the two metal layers exposed by the patterning of the metal bumps. The wafer is then exposed to a second acid solution to remove a portion of a second of the two metal layers exposed by the patterning of the metal bumps and the exposure of the wafer to the first acid solution. As a result, an undercut below the metal bumps, formed by removal of the portions of the first and second metal layers, is less than 1.5 microns.

Figure 1:
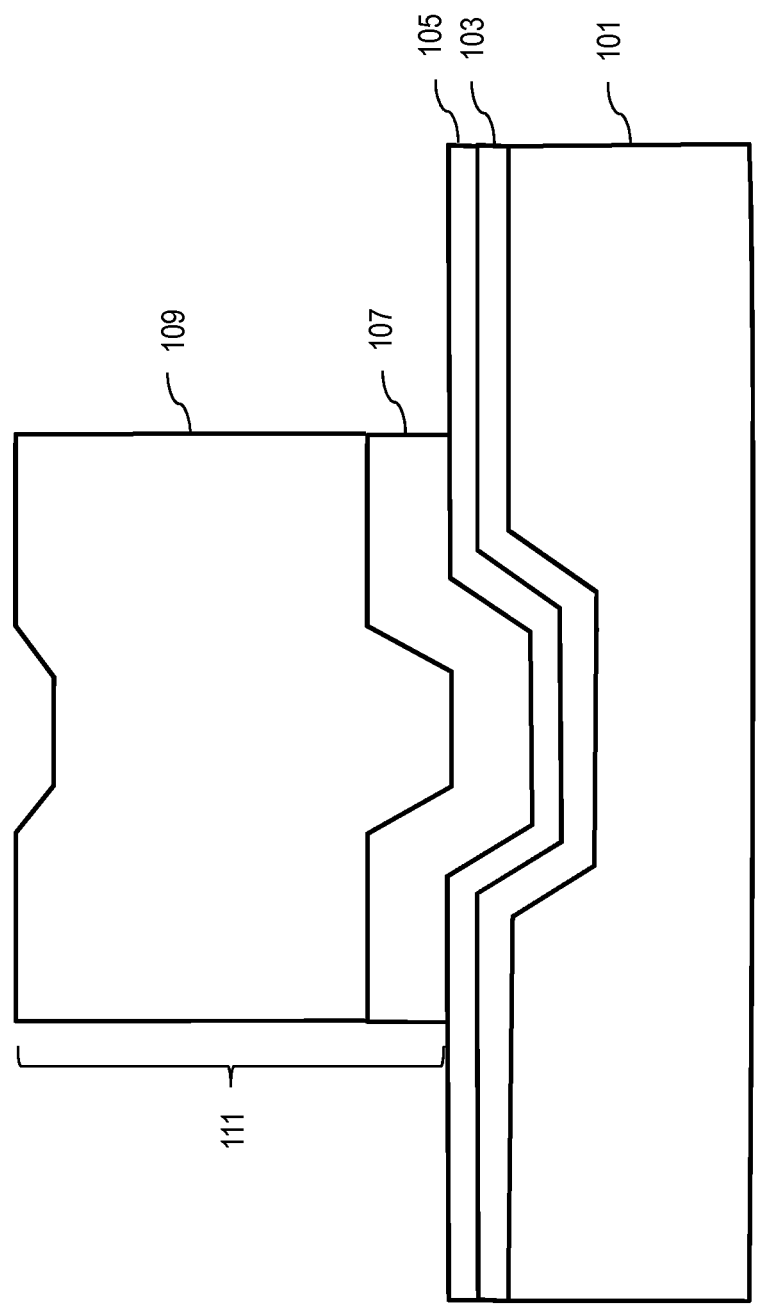

Adverting to FIG. 1, a method for wet etching a UBM layer, according to an exemplary embodiment, begins with a wafer 101. Although illustrated as a single layer, the wafer 101 may include other layers (not shown for illustrative convenience), such as a polyimide layer. The wafer 101 may further include a metal layer 103 and a metal layer 105. The metal layer 103 may be formed of Ti, e.g., to a thickness of 90 to 110 nm, such as 100 nm. The metal layer 105 may be formed of Cu, e.g., to a thickness of 270 to 330 nm, such as 300 nm. Together, the metal layer 103 and the metal layer 105 may constitute a UBM layer.

Above the metal layer 105 is a metal bump 111. The metal bump 111 may be formed to a height of 63 to 77 microns, such as 70 microns, and to a width of 50 to 70 microns, such as 60 microns. The metal bump 111 includes a bottom portion 107 and a top portion 109. The bottom portion may be formed of nickel (Ni) to a thickness of 2.7 to 3.3 microns, such as 3 microns. The top portion 109 may be formed of tin and silver (SnAg), for example, with a ratio of Sn to Ag of 98:2. Alternatively, the metal bump 111 may be formed of Cu with a thin portion of SnAg above the Cu (not shown for illustrative convenience). When the metal bump 111 is formed of Cu, the Cu of the metal bump 111 may be formed by ECD and the Cu of the metal layer 105 may be formed by PVD. The metal bump 111 may further be one of multiple metal bumps that are patterned above the metal layer 105.

Figure 2:
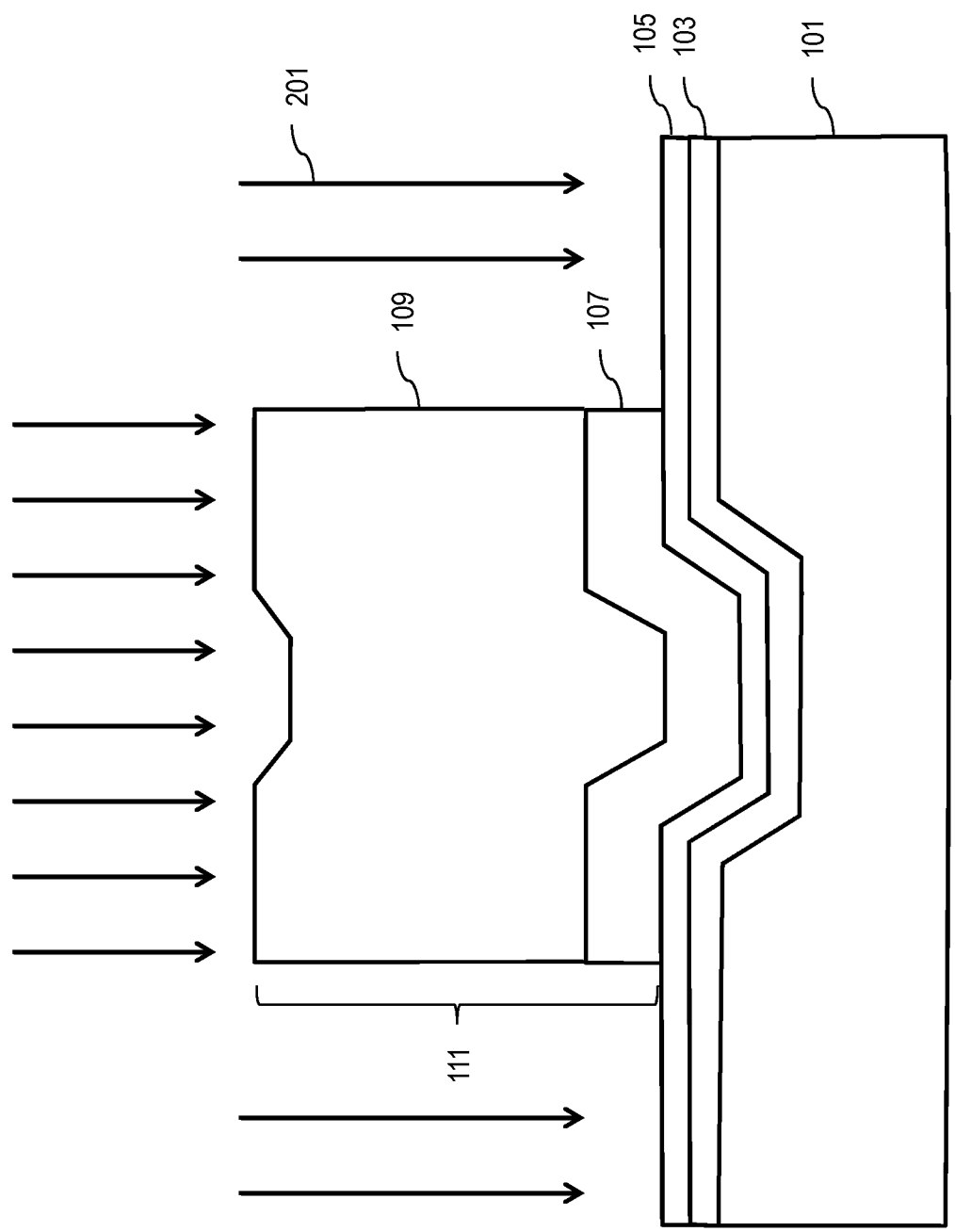

Adverting to FIG. 2, the metal bump 111 and the metal layer 105 are exposed to an acid solution 201. The acid solution 201 may include $H_3PO_4$, $H_2O_2$, and water. More specifically, the acid solution 201 may include 0.07% to 0.36% by volume of the $H_3PO_4$, 0.1% to 0.7% by volume of the $H_2O_2$, and the water for a remainder of the volume. Within the acid solution 201, the $H_2O_2$ acts as a buffer to control the etching of the layers on the wafer 101. The metal bump 111 and the metal layer 105 may be exposed to the acid solution 201 for 30 to 60 seconds at 30° to 40° C. using a batch or single spray tool.

Figure 3:
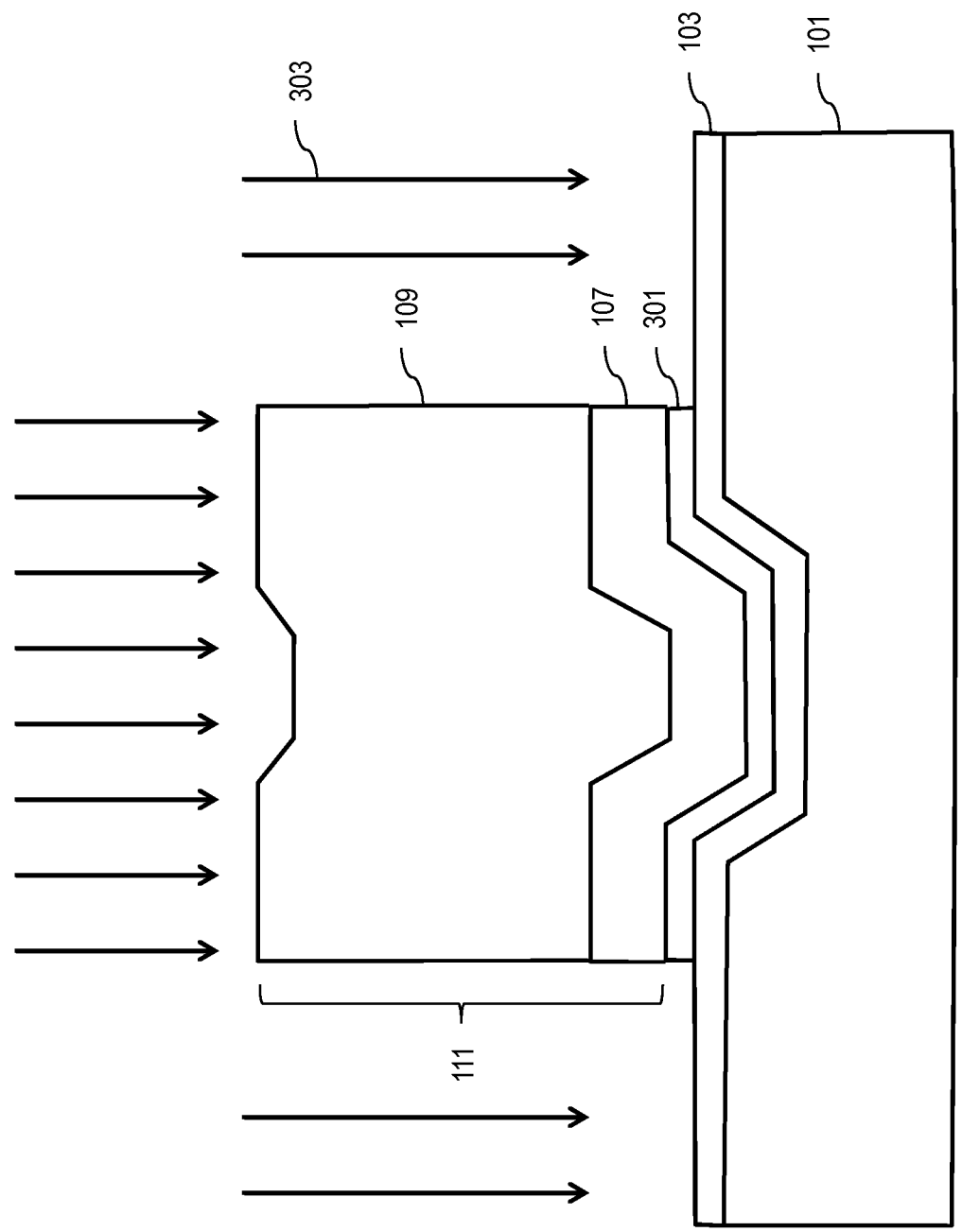

As illustrated in FIG. 3, the acid solution 201 completely removes a portion of the metal layer 105 exposed by the patterning of the metal bump 111 forming an etched metal layer 301. Subsequently, the etched metal layer 301 and the metal bump 111 are rinsed with deionized water 303 to stop the etching and wash away remaining etchant residue. The rinse of deionized water 303 may be for 60 to 120 seconds at 20° to 25° C.

Figure 4:
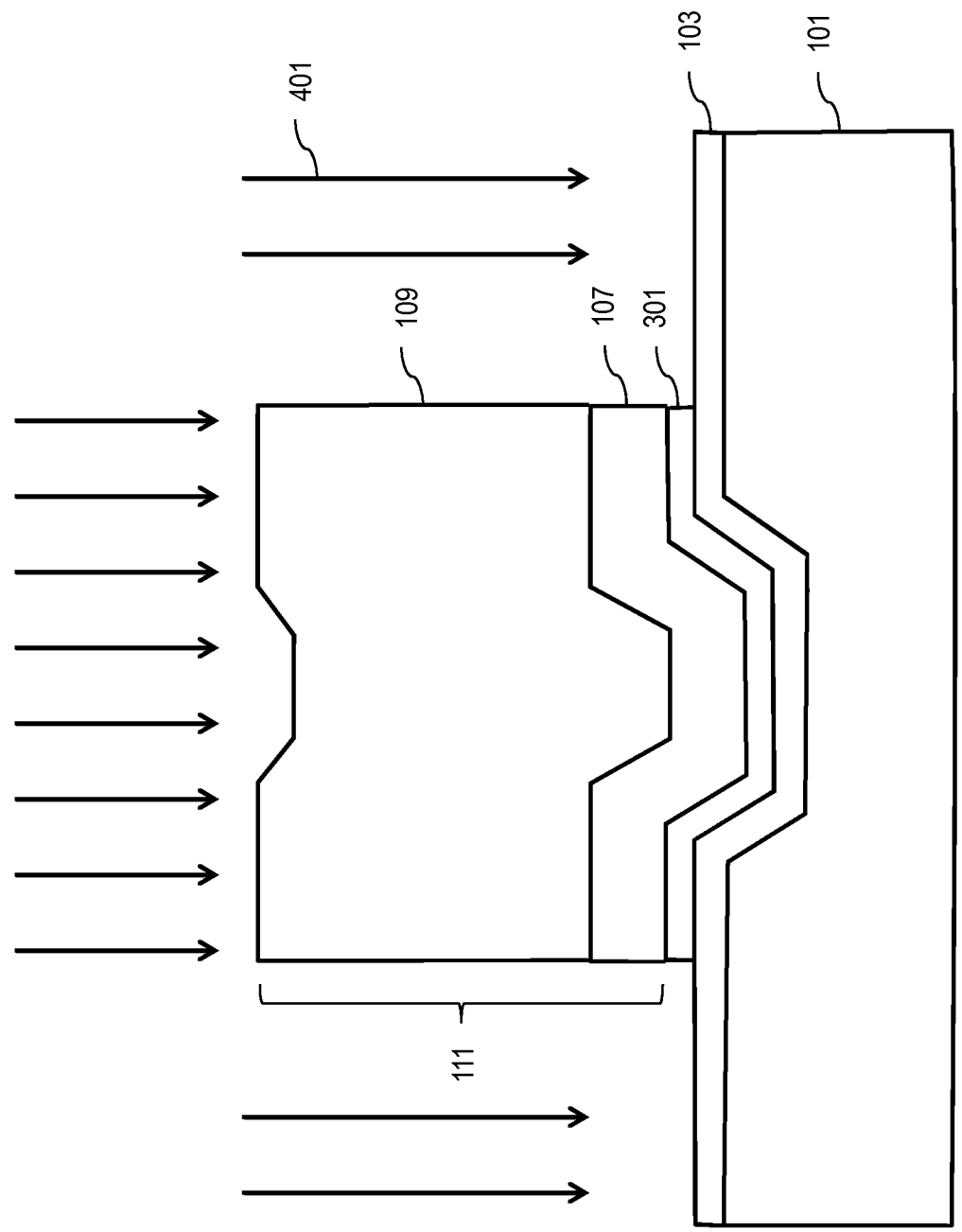

Adverting to FIG. 4, the metal bump 111, the etched metal layer 301 and the metal layer 103, where exposed by the etched metal layer 301 are exposed to another acid solution 401. The acid solution 401 may include dilute HF, HF in an organic solvent, or a mixture of APFM. Specifically, the acid solution 401 may include 0.1% to 0.49% by volume of the HF with water for a remainder of the volume. Alternatively, the acid solution 401 may include HF in ethyleneglycol. The metal bump 111, the etched metal layer 301, and the metal layer 103 exposed by the etched metal layer 301 may be exposed to the acid solution 401 for 30 to 60 seconds at 30° to 40° C.

Figure 5:
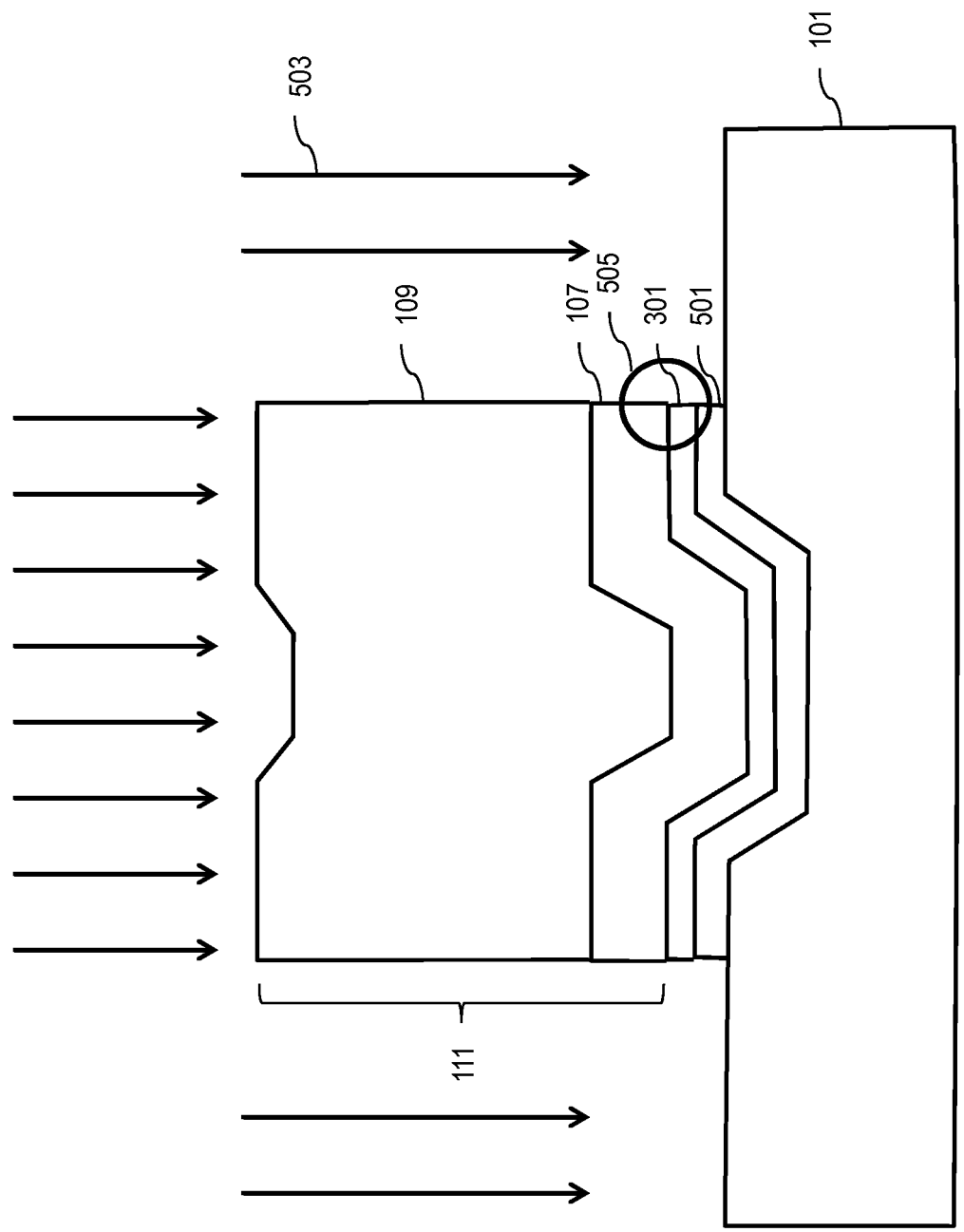

As illustrated in FIG. 5, the acid solution 401 completely removes a portion of the metal layer 103 exposed by the etched metal layer 301 forming an etched metal layer 501. Subsequently, the etched metal layer 501, the etched metal layer 301 and the metal bump 111 are again rinsed with deionized water 503 to stop the etching and wash away any remaining etchant residue. The rinse of deionized water 503 may be for 60 to 120 seconds at 20° to 25° C. using a batch or single spray tool.

Figure 6:
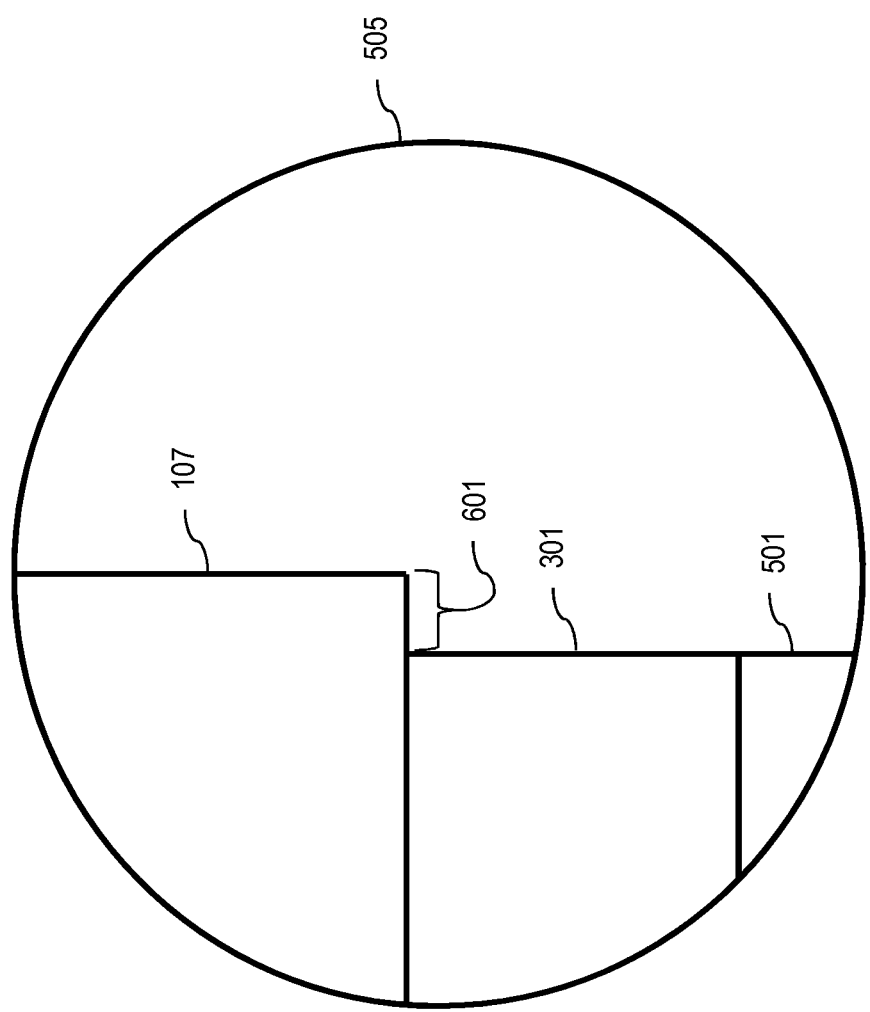

The encircled portion 505 of FIG. 5 is illustrated in greater detail in FIG. 6, which illustrates the undercut 601 formed by the metal layer 103 and the metal layer 105 being etched back past the edge of the bottom portion 107 of the metal bump 111. Based on the chemistry of the two acid solutions 201 and 401, the undercut is less than 1.5 microns. The undercut may more specifically be 1 micron, or even less than 1 micron. An undercut of less than 1.5 microns, as compared to an undercut of 2.5 to 3 microns, which is formed by conventional wet etchants, creates a more stable metal bump 111. Further, the two acid solutions 201 and 401 do not attack the bottom portion 107 of the metal bump 111 formed of Ni or, alternatively, Al if present in the metal bump 111. The two acid solutions 201 and 401, particularly the first acid solution 201, also exhibit selectivity for Cu layers formed by PVD rather than ECD, such that metal bumps that are formed of Cu deposited by PVD are selectively etched more than Cu deposited by ECD.

The embodiments of the present disclosure achieve several technical effects, including an undercut of a metal bump being less than 1.5 microns. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    patterning metal bumps on a wafer that has at least two metal layers thereon;
    exposing the wafer to a first acid solution to remove a portion of a first of the two metal layers exposed by the patterning of the metal bumps, wherein the first acid solution comprises 0.07% to 0.36% by volume of the $H_3PO_4$, 0.1% to 0.7% by volume of the $H_2O_2$, and the water for a remainder of the volume; and
    exposing the wafer to a second acid solution to remove a portion of a second of the two metal layers exposed by the patterning of the metal bumps and the exposure of the wafer to the first acid solution, wherein the second acid solution comprises 0.1% to 0.49% by volume of the HF with water for a remainder of the volume, HF in an organic solvent, or a mixture of ammonia, $H_2O_2$, fluorine and water (APFM),
    wherein an undercut below the metal bumps, formed by removal of the portions of the first and second metal layers etched back past an edge of a bottom portion of the metal bumps, is less than 1.5 microns.

2. The method according to claim 1, comprising exposing the wafer to the first acid solution for 30 to 60 seconds at 30° to 40° C.

3. The method according to claim 1, comprising exposing the wafer to the second acid solution for 20 to 40 seconds at 20° to 25° C.

4. The method according to claim 1, further comprising rinsing the wafer with deionized water after exposure with the first acid solution for 60 to 120 seconds at 20° to 25° C.

5. The method according to claim 4, further comprising rinsing the wafer with deionized water after exposure with the second acid solution for 60 to 120 seconds at 20° to 25° C.

6. The method according to claim 1, wherein the undercut formed by removal of the portion of the metal layers below the metal bumps is 1 micron.

7. The method according to claim 1, wherein the first and second metal layers comprise a copper layer having a thickness of 200 to 400 nanometers (nm) and a titanium layer having a thickness of 100 to 200 nm, respectively, and the portions of the copper layer and the titanium layer are completely removed after exposure to the first acid solution and the second acid solution.

8. The method according to claim 1, wherein the metal bumps include a first copper layer and the metal layers include a second copper layer, and the first acid solution is selective to the second copper layer over the first copper layer.

9. The method according to claim 8, further comprising:
    forming the first copper layer by electrochemical deposition (ECD) of the copper; and
    forming the second copper layer by physical vapor deposition (PVD) of the copper.

10. A method comprising:
    patterning metal bumps on an under bump metallization layer on a wafer;
    performing a first wet etch of the under bump metallization layer on the wafer with a solution comprising 0.07% to 0.36% by volume of phosphoric acid ($H_3PO_4$), 0.1% to 0.7% by volume of hydrogen peroxide ($H_2O_2$), and water for a remainder of the volume;
    rinsing the wafer with deionized water for 60 to 120 seconds at 20° to 25° C.;
    performing a second wet etch of the under bump metallization layer with a solution comprising 0.1% to 0.49% by volume of hydrofluoric acid (HF) with water for a remainder of the volume; and
    rinsing the wafer with deionized water for 60 to 120 seconds at 20° to 25° C.,
    wherein an undercut of the under bump metallization layer under the metal bumps formed by removing the under bump metallization layer exposed by the metal bumps is 1 micron.

11. The method according to claim 10, the under bump metallization layer comprising a copper layer having a thickness of 200 to 400 nanometers and a titanium layer having a thickness of 100 to 200 nm, and the copper layer and the titanium layer are completely removed where exposed by the metal bumps after the first wet etch and the second wet etch.

* * * * *